United States Patent
Ohta

(10) Patent No.: US 7,223,303 B2
(45) Date of Patent: May 29, 2007

(54) SILICON CLEANING METHOD FOR SEMICONDUCTOR MATERIALS AND POLYCRYSTALLINE SILICON CHUNK

(75) Inventor: Hirotake Ohta, Tokyo (JP)

(73) Assignees: Mitsubishi Materials Corporation, Tokyo (JP); Mitsubishi Polycrystalline Silicon America Corporation, Theodore, AL (US)

( * ) Notice: Subject to any disclaimer, the term of this patent is extended or adjusted under 35 U.S.C. 154(b) by 39 days.

(21) Appl. No.: 10/928,682

(22) Filed: Aug. 26, 2004

(65) Prior Publication Data

US 2006/0042539 A1    Mar. 2, 2006

(51) Int. Cl.
    *C30B 15/20* (2006.01)
(52) U.S. Cl. .......................... 117/13; 117/11
(58) Field of Classification Search .............. 117/11, 117/13
    See application file for complete search history.

(56) References Cited

U.S. PATENT DOCUMENTS 6,557,569 B2 *  5/2003  Katagiri et al. ............ 134/25.4
6,783,748 B2 *  8/2004  Tanaka et al. ............... 423/584

FOREIGN PATENT DOCUMENTS

JP           2003-245667 A1     9/2003

OTHER PUBLICATIONS

"Silicon Chemistry", Realize Corp., pp. 903-908.
Silicon Technologies Committee, "Standard of JEITA EM-3601", 1974.

* cited by examiner

*Primary Examiner*—Felisa Hiteshew
(74) *Attorney, Agent, or Firm*—Darby & Darby

(57) ABSTRACT

A cleaning method cleans silicon for semiconductor materials using pure water treated by a reverse osmosis treatment and by ion exchange treatment and reduces the aluminum and iron remaining on the silicon surface.

19 Claims, 1 Drawing Sheet

ACID CLEANING

PUREWATER CLEANING

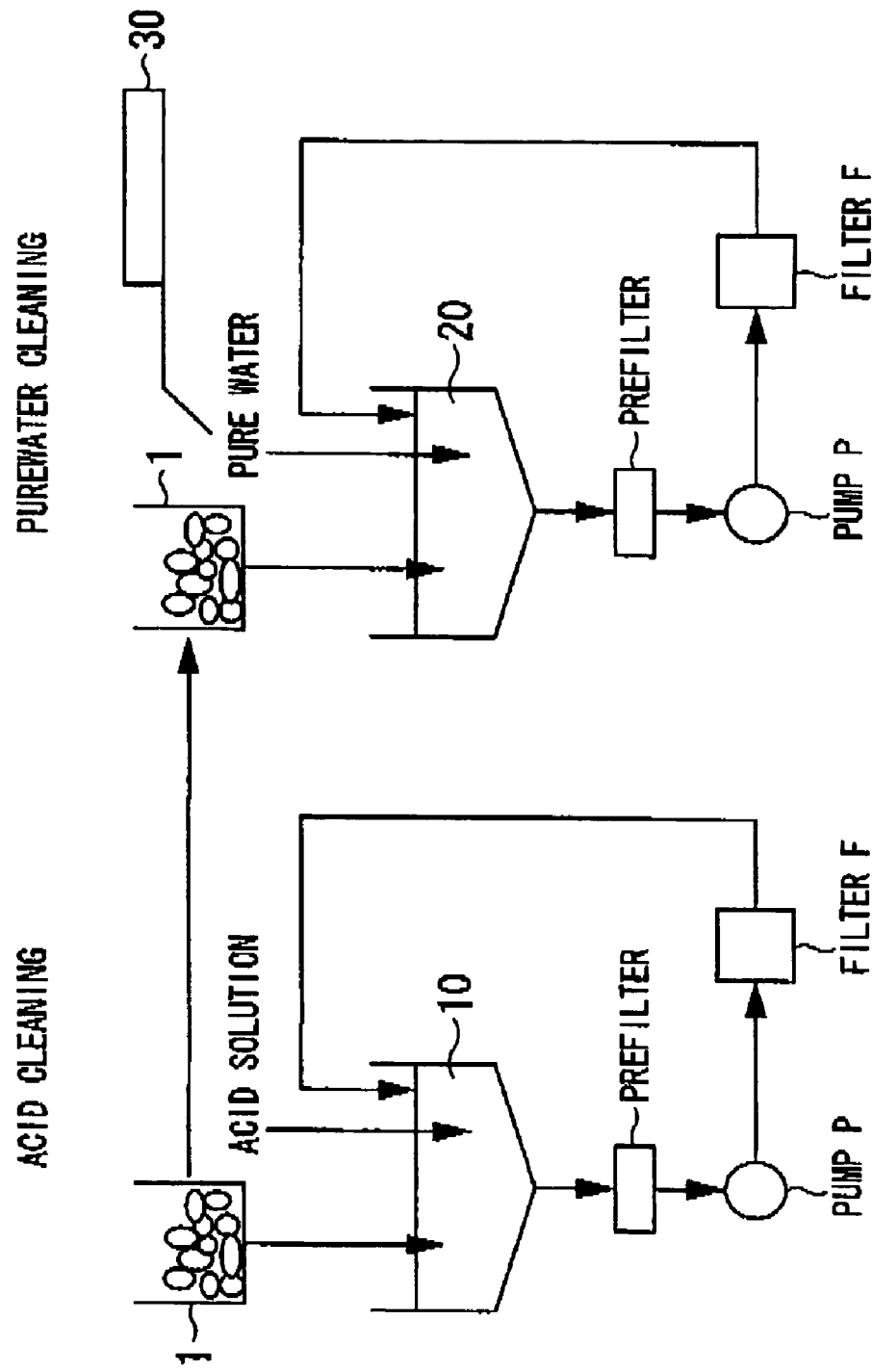

SILICON CLEANING METHOD FOR SEMICONDUCTOR MATERIALS AND POLYCRYSTALLINE SILICON CHUNK

BACKGROUND OF THE INVENTION

1. Field of the Invention

The present invention relates to a silicon cleaning method for semiconductor materials, to a polycrystalline silicon chunk and to a silicon cleaning device.

2. Description of the Related Art

The single crystal silicon wafers used for semiconductors are produced by melting high-purity polycrystalline silicon (referred to as polysilicon) as a raw material, pulling the single crystal silicon from the molten polysilicon by a method commonly referred to as the CZ method (Czochralski method) and processing this into wafers. The polycrystalline silicon serving as the raw material of the single crystal silicon is mainly obtained in the form of rod-shaped ingots by a CVD reaction in a water-cooled bell jar which is commonly referred to as the Siemens method. These polycrystalline silicon ingots are sent to a single crystal pulling process after going through various processes consisting of cutting, crushing, classifying, acid cleaning, pure water rinsing, drying and packaging, which are conducted in that order.

As has been described above, bulk polycrystalline silicon, which is obtained by cutting, crushing and classifying the polycrystalline silicon ingots, is subjected to acid cleaning and pure water rinsing to make sure of removal of contaminants. The acid cleaning uses a mixed liquid of hydrofluoric acid and nitric acid to completely remove contaminating impurities adhered to the surface of the polycrystalline silicon, and an oxide film on the surface of the polycrystalline silicon chunk is removed by the mixed liquid. The acid cleaning is followed by rinsing with pure water, drying and packaging to obtain shipped products.

The aforementioned pure water cleaning is the final step of the cleaning process, and the pure water used for cleaning is required to be of high purity and, if possible, not any contain impurities. For example, in the pure water cleaning of wafers, a pure water supply system for obtaining high-purity water is known in which the untreated water is passed through activated charcoal to remove high molecular weight organic substances and residual chlorine, this water is then passed through a cation exchanger and anion exchanger to remove other residual ion components such as metal ions, and finally the water is passed through a reverse osmosis apparatus to remove ion components, organic substances and fine particles (see "Silicon Chemistry", pp. 903–908, 1996, Realize Corp.). In addition, as an example of a typical high-purity water production system, a water purifying apparatus has been proposed that uses a reverse osmosis membrane unit while also providing an ion exchange unit for the final filtration member (see Japanese Unexamined Patent Application, First Publication No. 2003-245667).

In the field of semiconductors, increasingly severe quality requirements are being placed on the raw material single crystal silicon accompanying the increasing levels of integration degree. Particularly, requirements for reducing impurities are becoming extremely severe. For example, a method is required wherein the method can decrease impurity concentrations to levels lower than that by the pure water cleaning method of the prior art using the aforementioned pure water supply system (see the aforementioned "Silicon Chemistry"). On the other hand, the water purifying apparatus of the prior art that combines a reverse osmosis device and ion exchange device (see Japanese Unexamined Patent Application, First Publication No. 2003-245667) is intended to be used for the purpose of obtaining highly pure water efficiently, easily and inexpensively. However, an action of removing specific metal ions is not at all discussed in the prior art of the water purifying apparatus.

SUMMARY OF THE INVENTION

The present invention provides a pure water cleaning method that can satisfy such requirements for reducing impurity concentrations of silicon for semiconductor materials. The inventor of the present invention found that removal effects with respect to certain types of metal ions are extremely improved by using pure water that has been purified by combining reverse osmosis treatment and ion exchange treatment during pure water cleaning of polycrystalline silicon chunk used as single crystal silicon raw materials in particular. The present invention is based on the aforementioned finding, and provides an excellent pure water cleaning method capable of significantly reducing specific metal ions.

The present invention provides the following cleaning method.

The first aspect of the present invention is a silicon cleaning method. The method comprises steps of:

preparing silicon for semiconductor materials to be cleaned;

preparing pure water by performing reverse osmosis purification treatment and ion exchange purification treatment on water;

cleaning the silicon for semiconductor materials using the pure water; and obtaining silicon for semiconductor materials wherein amounts of aluminum and iron remaining on the surface of the silicon are reduced by the cleaning.

The cleaning method may be at least one of;

a cleaning method that is applied in a pure water rinsing process following acid cleaning process of polycrystalline silicon chunk used as a raw material of single crystal silicon, a cleaning method applied in a pure water cleaning process of a processing process of single crystal silicon wafer, and a cleaning method applied in a pure water cleaning process of a device process.

A residual aluminum concentration and a residual iron concentration after pure water cleaning of the method of the first aspect of the present invention may be reduced to one-third or less of the concentrations immediately before pure water cleaning.

The cleaning method may be a method which is used in a pure water cleaning process following acid cleaning process of polycrystalline silicon chunk used as a raw material of single crystal silicon, and the polycrystalline silicon chunk is cleaned using the pure water treated by the reverse osmosis purification treatment and the ion exchange purification treatment, and both of the residual aluminum concentration and the residual iron concentration on the surface of the polycrystalline silicon chunk are reduced to 0.1 ppbw or less by the cleaning method.

A filter purification device my be provided at least before or after the reverse osmosis purification treatment and ion exchange purification treatment, and pure water from which fine particles have been removed is provided by providing the filter purification device, and polycrystalline silicon chunk is cleaned by using the pure water.

The second aspect of the present invention is a polycrystalline silicon chunk used as a raw material of single crystal silicon in which the concentrations of aluminum and iron remaining on the surface of the polycrystalline silicon chunk are both reduced to 0.1 ppbw or less by pure water cleaning using pure water treated with both reverse osmosis purification treatment and ion exchange purification treatment performed after acid cleaning.

The acid cleaning and the pure water cleaning may be performed in order to remove contaminants from polycrystalline silicon chunk obtained by cutting, crushing, and classifying polycrystalline silicon ingots.

A method for growing silicon single crystals having a high dislocation free ratio may be provided by a method comprising: preparing the polycrystalline silicon of the second aspect of the present invention, and pulling single crystals by the Czochralski method using the polycrystalline silicon for the raw material.

The third aspect of the present invention is a silicon cleaning device for semiconductor materials. The device comprises:

a purification treatment unit equipped with a reverse osmosis unit that performs purification treatment by reverse osmosis and an ion exchange unit that performs purification treatment by ion exchange, and which supplies pure water that has been subjected to both treatments, and a pure water cleaning tank for cleaning silicon for semiconductor materials to which pure water from the purification treatment unit is supplied.

The cleaning device according may comprises with an acid cleaning tank for cleaning silicon for semiconductor materials.

BRIEF DESCRIPTION OF THE DRAWINGS

FIG. 1 is a conceptual view showing a cleaning process for polycrystalline silicon chunk.

DETAILED DESCRIPTION OF THE INVENTION

The present invention relates to a silicon cleaning method for semiconductor materials, to a polycrystalline silicon chunk and to a silicon cleaning device. More specifically, the present invention relates to a cleaning method, a polycrystalline silicon chunk obtained by the method and a silicon cleaning device, wherein the method has superior cleaning effects on aluminum and iron in a pure water cleaning process for single crystal silicon wafers, polycrystalline silicon, which is served as a raw material for single crystal silicon for semiconductors, and the like.

The following provides a concrete explanation of the present invention.

The cleaning method of the present invention is a silicon cleaning method for semiconductor materials that can reduce residual aluminum and residual iron remained on the surface of silicon. The method is achieved by following pure water cleaning wherein silicon for semiconductor materials is cleaned using pure water that has undergone both purification treatment by reverse osmosis (referred to as RO treatment) and purification treatment by ion exchange (referred to as EX treatment).

The cleaning method of the present invention is applied to cleaning of silicon for semiconductor materials. This silicon for semiconductor materials may be any silicon which can be used for semiconductor materials. Examples thereof include single crystal silicon wafers and polycrystalline silicon chunk used as a single crystal silicon raw material. More specifically, the cleaning method of the present invention can be applied to, for example, a pure water rinsing process which is conducted after acid cleaning of polycrystalline silicon chunk used as single crystal silicon raw materials, a processing process for single crystal silicon wafers, a pure water cleaning process of a device process and the like. It is particularly useful in the pure water cleaning of polycrystalline silicon chunk used as single crystal silicon raw materials.

The cleaning method of the present invention uses pure water that has been purified by combining treatment by reverse osmosis (RO treatment) and treatment by ion exchange (EX treatment). Further, it is preferable that a purification member using a filtration filter is provided at least before and/or after the RO treatment and/or EX treatment in order to use pure water from which fine particles have been adequately removed. Conventional units can be used for a reverse osmosis unit (RO unit) used for reverse osmosis treatment, ion exchange unit (EX unit) used for ion exchange purification treatment, and an ultra filtration unit.

In the case of using purified water obtained by arranging the RO and EX units in the order of the RO unit followed by the EX unit for cleaning silicon, extraordinarily remarkable reduction effects are observed for aluminum and iron in residual metal impurities on a polysilicon surface. Water treated with the RO and EX units arranged in the opposite order may also be used preferably in the present invention. In addition, water may also be treated by using a plurality of one or both of the RO and EX units. The order of the units in this treatment may be selected optionally.

The cleaning method of the present invention can be applied to any processes in the production or treatment of polycrystalline silicon, when cleaning which use pure water is required in the processes. Particularly remarkable effects can be obtained if the method is applied in a pure water rinsing process following an acid cleaning process. In the rinsing process, it may maintain a pure water flow in one direction. A circulation path may be provided that extracts pure water utilized for cleaning from the rinsing tank after cleaning and reuses that water for cleaning. Further, cleaning costs can be reduced when a filtration filter is provided in this circulation path so as to remove particles and the like.

In a pure water cleaning process for cleaning polycrystalline silicon chunk, it is more preferable when fine particles in the pure water are adequately removed by providing a purification device using a filtration filter at least before or after the RO unit and EX unit, or before and/or after both units. The aforementioned filter can be preferably applied to the cleaning method of the present invention.

According to the cleaning method of the present invention, the concentrations of aluminum and iron remaining on the surface of polycrystalline silicon chunk after pure water cleaning of the present invention can be reduced to one-third or less the concentrations of aluminum and iron remaining on the surface of the polycrystalline chunk which is immediately before pure water cleaning such as a pure water rinsing process following acid cleaning process of polycrystalline silicon chunk.

More specifically, for example, in the case of pure water rinsing using pure water immediately after ion exchange treatment only, the residual aluminum concentration is 0.1 ppbw while the residual iron concentration is 0.16 ppbw. On the other hand, in the case of pure water rinsing using pure water subjected to reverse osmosis treatment following ion exchange treatment, the residual aluminum concentration is 0.034 ppbw while the residual iron concentration is 0.017 ppbw.

Thus, residual concentrations thereof can be considerably reduced by the present invention. In this manner, according to the pure water cleaning of the present invention, polycrystalline silicon chunk can be obtained in which both of the residual aluminum concentration and residual iron concentration are generally 0.1 ppbw or less.

The cleaning method of the present invention makes it possible to achieve superior cleaning effects in pure water cleaning of silicon for semiconductor materials. In particular, when the cleaning method of the present invention is applied to pure water rinsing after acid cleaning in the cleaning process of high-purity polycrystalline silicon chunk used as single crystal silicon raw materials, the concentrations of aluminum and iron remaining on the surface of the polycrystalline silicon chunk can be significantly reduced, and as a result, the level of impurities is remarkably improved, thereby making it possible to significantly improve the single crystal conversion ratio (dislocation free ratio) of the single crystal silicon pulling process. That is, silicon single crystals having a high dislocation free ratio can be grown by pulling silicon single crystals according to the CZ method using polycrystalline silicon subjected to the pure water cleaning method of the present invention as a raw material.

EXAMPLES

Examples of the present invention are described below. Furthermore, the scope of the present invention is not limited by the aspects illustrated in the examples.

Example 1

The cleaning method of the present invention was applied to a pure water rinsing process following an acid cleaning process for a polycrystalline silicon chunk. The acid cleaning process and pure water cleaning process are performed continuously as shown in FIG. 1. As shown in the drawing, a circulation path is provided to each of cleaning tanks 10 and 20 so that, after waste cleaning water is extracted from the bottom of each tank and treated with a filter, water is returned to each of the cleaning tanks. A pre-filter, pump and filter are intermediately provided in the aforementioned circulation paths. While still housed in polyethylene basket 1, the polycrystalline silicon chunk is cleaned by moving from acid cleaning tank 10 to pure water rinsing tank 20 at predetermined immersion times. Furthermore, acid cleaning tank 10 and/or pure water rinsing tank 20 may be formed by multiple tanks.

A mixed liquid of hydrofluoric acid and nitric acid (70 wt % nitric acid: 50 wt % hydrofluoric acid=10:1 (volume ratio)) is supplied to acid cleaning tank 10 and maintained at a liquid temperature of 30° C. Treated pure water purified by purification treatment unit 30 is supplied from the unit 30 to pure water rinsing tank 20 and maintained at a water temperature of 25° C. An RO unit and an EX unit are provided in purification treatment unit 30, and these are arranged so that water is treated by passing through the RO unit and then passing through the EX unit. Following cleaning, the silicon chunk cleaned was placed in a hot air dryer and dried at 70° C. After drying, the concentrations of metals remaining on the surface of the polycrystalline silicon were measured. Measurement of the concentration was performed in accordance with the standards of JEITAEM-3601. Those results are shown in Table 1.

Comparative Example 1

Polycrystalline silicon chunk was cleaned under the same conditions as Example 1 except that pure water, which was treated only with an EX unit without using an RO unit in the cleaning process shown in the drawing, was utilized. Those results are shown in Table 1.

In Comparative Example 1, the concentrations of aluminum and iron both exceeded 0.1 ppbw, and were both significantly higher as compared with the example 1. On the other hand, in Example 1 of the present invention, the concentrations of aluminum and iron decreased considerably. The concentration of aluminum decreased to 0.03 ppbw and the concentration of iron decreased to 0.01 ppbw which was same level as Na and Mg. The impurity levels of polycrystalline silicon chunk treated with pure water obtained by RO treatment and EX treatment are corresponding to about one-third or less and about one-ninth or less of the impurity levels of polycrystalline silicon chunk treated with pure water which is obtained by only EX treatment (comparative example 1).

TABLE 1

| (unit: ppbw) | Al | Fe | Cr | Ni | Na | Zn | Cu | Mg | Co | Mn |
| --- | --- | --- | --- | --- | --- | --- | --- | --- | --- | --- |
| Ex. 1 (RO→EX) | 0.034 | 0.017 | 0.004 | 0.002 | 0.016 | 0.004 | 0.002 | 0.013 | 0.001 | 0.004 |
| Comp. Ex. 1 (EX) | 0.118 | 0.164 | 0.015 | 0.006 | 0.026 | 0.004 | 0.004 | 0.020 | 0.001 | 0.009 |

Example 2

An 8-inch silicon single crystal was pulled by the CZ method using the polycrystalline silicon shown in Example 1 of Table 1. 150 kg of polyarystalline silicon were charged per one pulling. Pulling was conducted 10 times under the same conditions. The average dislocation free ratio thereof was 98%. On the other hand, when silicon single crystal was pulled under the same conditions using the polycrystalline silicon shown in the comparative example 1 of Table 1, the average dislocation free ratio thereof was 85%.

While preferred embodiments of the invention have been described and illustrated above, it should be understood that these are exemplary of the invention and are not to be considered as limiting. Additions, omissions, substitutions and other modifications can be made without departing from the spirit or scope of the present invention. Accordingly, the invention is not to be considered as being limited by the foregoing description, and is only limited by the scope of the appended claims.

What is claimed is:

1. A silicon cleaning method comprising the steps of:
preparing silicon for semiconductor materials to be cleaned;
preparing pure water by performing a reverse osmosis purification treatment and an ion-exchange purification treatment on water;
cleaning the silicon for semiconductor materials using the pure water; and
obtaining silicon for semiconductor materials,
wherein amounts of a residual aluminum concentration and a residual iron concentration remaining on the surface of the silicon after the cleaning step are reduced to one-third or less of respective concentrations prior to the cleaning step.

2. A cleaning method according to claim 1, wherein the cleaning method is at least one of:
a cleaning method that is applied in a pure water rinsing process following an acid cleaning process of a polycrystalline silicon chunk used as a raw material of single crystal silicon,
a cleaning method applied in a pure water cleaning process of a processing process of single crystal silicon wafer, and
a cleaning method applied in a pure water cleaning process of a device process.

3. A cleaning method according to claim 1, wherein the cleaning method is a method which is used in a pure water cleaning process following an acid cleaning process of a polycrystalline silicon chunk used as a raw material of a single crystal silicon, and the polycrystalline silicon chunk is cleaned using the pure water treated by the reverse osmosis purification treatment and the ion-exchange purification treatment, and both of the residual aluminum concentration and the residual iron concentration on the surface of the polycrystalline silicon chunk are reduced to 0.1 ppbw or less by the cleaning method.

4. A cleaning method according to claim 3, wherein a filter purification device is provided at least before or after the reverse osmosis purification treatment and ion-exchange purification treatment, pure water from which fine particles have been removed is provided by providing the filter purification device, and the polycrystalline silicon chunk is cleaned by using the pure water.

5. The cleaning method according to claim 1, further comprising the steps of:
cleaning the silicon using an acid in an acid cleaning process; and
cleaning the silicon using the pure water in a pure water rinsing process.

6. The cleaning method according to claim 5, wherein the step of cleaning the silicon using the pure water in a pure water rinsing process follows the step of cleaning the silicon using an acid in an acid cleaning process.

7. The cleaning method according to claim 5, wherein the pure water rising process further comprises the step of:
maintaining a pure water flow in one direction.

8. The cleaning method according to claim 5, further comprising the steps of:
housing the silicon in a polyethylene basket; and
moving the silicon housed in the polyethylene basket from an acid cleaning tank to a pure water rinsing tank.

9. The cleaning method according to claim 8, wherein the step of moving the silicon occurs at predetermined immersion times.

10. The cleaning method according to claim 5, wherein the step of cleaning the silicon using an acid in an acid cleaning process further comprises the step of:
using a mixed liquid of hydrofluoric acid and nitric acid for the acid cleaning process; and
maintaining the mixed liquid of hydrofluoric acid and nitric acid at a liquid temperature of about 30 degrees Celsius.

11. The cleaning method according to claim 10, wherein the mixed liquid of hydrofluoric acid and nitric acid comprises:
a 70 wt % solution of nitric acid; and
a 50 wt % solution of hydrofluoric acid in a 10:1 volume ratio.

12. The cleaning method according to claim 1, further comprising the steps of:
providing a circulation path;
using the circulation path to extract the pure water from a pure water rinsing tank after the cleaning step; and
using the circulation path to reuse the extracted pure water for subsequent cleaning.

13. The cleaning method according to claim 12, further comprising the steps of:
extracting waste water from a bottom of a cleaning tank;
treating the extracted waste water with a filtration filter provided in the circulation path to remove particles from the extracted waste water; and
returning the treated waste water to the cleaning tank through the circulation path.

14. The cleaning method according to claim 1, further comprising the steps of:
supplying the pure water from a purification treatment to the pure water rinsing process; and
maintaining the pure water at a water temperature of about 25 degrees Celsius.

15. The cleaning method according to claim 1, further comprising the steps of:
placing the cleaned silicon in a hot air dryer; and
drying the cleaned silicon at a temperature of about 70 degrees Celsius.

16. The cleaning method according to claim 1, wherein the amounts of the residual aluminum concentration and residual iron concentration in the cleaned silicon are 0.1 ppbw or less.

17. A silicon cleaning method comprising the steps of:
preparing silicon for semiconductor materials to be cleaned, the silicon having initial amounts of aluminum concentration and iron concentration present on the silicon surface;
preparing pure water by performing a reverse osmosis purification treatment and an ion-exchange purification treatment on water;
cleaning the silicon using an acid cleaning process in an acid cleaning tank;
cleaning the silicon using the pure water in a pure water rinsing process in a pure water rinsing tank;
recycling the pure water via a filter through a circulation path; and
obtaining silicon for semiconductor materials,
wherein subsequent amounts of a residual aluminum concentration and a residual iron concentration remaining on the surface of the silicon are reduced to one-third or less of the initial amounts of aluminum concentration and iron concentration present on the silicon surface.

18. The cleaning method according to claim 17, further comprising the steps of:
  placing the cleaned silicon in a hot air dryer;
  drying the cleaned silicon at a temperature of about 70 degrees Celsius.

19. The cleaning method according to claim 17, further comprising the steps of:
  housing the silicon in a polyethylene basket; and
  moving the silicon housed in the polyethylene basket from the acid cleaning tank to the pure water rinsing tank.

\* \* \* \* \*